United States Patent [19]

Reichelderfer et al.

[11] 4,380,488

[45] Apr. 19, 1983

[54] PROCESS AND GAS MIXTURE FOR ETCHING ALUMINUM

[75] Inventors: Richard F. Reichelderfer, Castro Valley; Diane C. Vogel, Union City; Marian C. Tang, Hercules, all of Calif.

[73] Assignee: Branson International Plasma Corporation, Hayward, Calif.

[21] Appl. No.: 317,582

[22] Filed: Nov. 2, 1981

Related U.S. Application Data

[63] Continuation-in-part of Ser. No. 196,616, Oct. 14, 1980, abandoned.

[51] Int. Cl.³ .............................................. C23F 1/02
[52] U.S. Cl. ................................... 156/643; 156/646; 156/651; 156/659.1; 156/345; 204/192 E; 252/79.1
[58] Field of Search ............... 156/643, 646, 345, 650, 156/651, 656, 659.1, 665; 204/164, 192 E, 298; 427/38, 39; 252/79.1

[56] References Cited

U.S. PATENT DOCUMENTS

| 4,178,877 | 12/1979 | Kudo | 156/646 X |
| 4,182,646 | 1/1980 | Zajac | 156/646 X |
| 4,256,534 | 3/1981 | Levinstein et al. | 156/656 X |
| 4,267,013 | 5/1981 | Iida et al. | 156/643 |
| 4,299,680 | 11/1981 | Fontana et al. | 156/656 X |
| 4,308,089 | 12/1981 | Iida et al. | 156/643 |
| 4,352,724 | 10/1982 | Sugishima et al. | 204/192 E |

Primary Examiner—William A. Powell
Attorney, Agent, or Firm—Flehr, Hohbach, Test, Albritton & Herbert

[57] ABSTRACT

Process and gas mixture for etching aluminum in a plasma environment in a planar reactor. The gas mixture comprises a primary etching gas and a secondary gas which controls the anisotropic character of the etch. A stable uniform plasma is generated at relatively high pressure and power levels, and this provides substantially faster removal of aluminum than has heretofore been possible in planar reactors.

11 Claims, 1 Drawing Figure

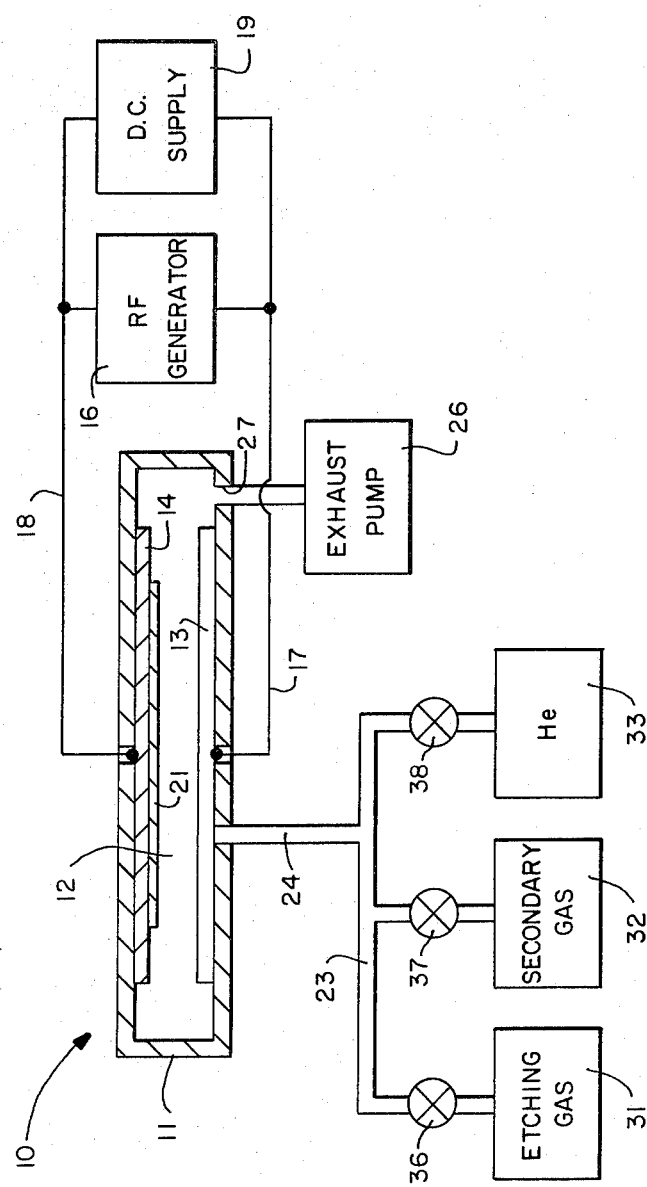

PROCESS AND GAS MIXTURE FOR ETCHING ALUMINUM

CROSS REFERENCE TO RELATED APPLICATION

This application is a continuation-in-part of Ser. No. 196,616, filed Oct. 14, 1980, now abandoned.

This invention pertains generally to etching processes and gases and more particularly to a process and gas mixture for etching aluminum in a plasma environment.

In a planar plasma reactor, the material to be processed is positioned between a pair of electrode plates which are energized with radio frequency power to ionize a reagent gas and form active species for carrying out the desired process. Such reactors are utilized, for example, for etching silicon, silicon dioxide, silicon nitride, aluminum and other materials in the fabrication of semiconductor devices.

Heretofore, plasma etching processes have been carried out at relatively low pressures (e.g. 100–600 microns) in planar reactors. With higher pressures, it is difficult to strike and maintain a stable, uniform plasma, and photoresist masking tends to breakdown. Aluminum is typically etched in such systems at a relatively slow rate, e.g., 1500 angstroms/minute. Throughout this application, the term aluminum is used generically to include pure aluminum and aluminum alloys such as an aluminum-silicon alloy containing up to 2 percent silicon.

It is in general an object of the invention to provide a new and improved process and gas mixture for etching aluminum in a plasma reactor.

Another object of the invention is to provide a process and gas of the above character which are capable of anisotropically, removing aluminum more rapidly than conventional techniques, without photoresist breakdown.

Another object of the invention is to provide a process and gas mixture of the above character utilizing higher pressures and power densities than conventional etching processes in planar reactors.

These and other objects are achieved in accordance with the invention by employing a gas mixture comprising a primary etching gas mixture containing $BCl_3$ and chlorine, or $CCl_4$ and chlorine, and a secondary gas such as $CHCl_3$ or $SiCl_4$ for controlling the anisotropic character of the etch. The aluminum to be etched is placed between the electrodes of the reactor, the primary etching gas mixture is admitted at a pressure on the order of 20–500 microns, and the secondary gas is admitted at a pressure on the order of 20–150 microns. The electrodes are then energized to ionize the gas and form active species in the region between the electrodes. A third gas such as helium is introduced at a pressure on the order of 0.5–7 torr to prevent breakdown of photoresist in proximity to the aluminum.

The single FIGURE of drawing is schematic illustration of one embodiment of apparatus for carrying out the process of the invention.

As illustrated in the drawing, the process is carried out in a planar reactor 10 having a housing 11 defining a reaction chamber 12. The housing is provided with a suitable access door (not shown) through which wafers or other materials to be etched are introduced into and removed from the chamber. The reactor also includes a pair of planar electrodes 13, 14 which are spaced apart in a generally parallel relationship within the chamber.

In one presently preferred embodiment, the electrodes are circular plates having a diameter on the order of 3½–4½ inches, and they are spaced apart by a distance on the order of 0.5–2 inches. The electrodes are energized by a radio frequency generator 16 which is connected to the electrodes by leads 17, 18. The generator operates at a suitable frequency (e.g. 13.56 MHz) and delivers a power output on the order of 50–500 watts to produce an electric field for ionizing the gas to form a plasma in the region between the electrodes. During operation of the reactor, the electrodes are maintained at a temperature on the order of 5°–40° C. by coolant circulating through passageways (not shown) in the electrodes. Upper electrode 14 is grounded electrically to reactor housing 11, and lower electrode 13 is insulated from the housing.

A DC bias can be applied to the electrodes by a DC supply 19 which is connected electrically in parallel with RF generator 16. The bias consists of a voltage on the order of 150 volts or less, and it serves to make the etch more anisotropic, as well as reducing the amount of residue left on the material being etched and helping to preserve the integrity of photoresist. A wafer 21 to be processed is positioned between the electrodes, and in the embodiment illustrated, this wafer is mounted on the bottom surface of upper electrode 14. The wafer is secured to the electrode by a vacuum chuck or other suitable means (not shown).

Gas is supplied to the chamber through a manifold 23 and an inlet line 24. Lower electrode 13 is fabricated of a porous material, and the gas is diffused into the chamber through this electrode. Introducing the gas in this manner has been found to provide faster and more uniform etching of the aluminum than would otherwise be possible. An exhaust pump 26 is connected to an exhaust port 27 for removing gas from the reactor chamber and maintaining the desired level of pressure within the chamber.

The reagent gas comprises a mixture of a primary etching gas mixture and a secondary gas for controlling the anisotropic character of the etch. A third gas is included in the mixture to prevent the breakdown of photoresist. As illustrated in the drawing, the gases are supplied by an etching gas source 31, a secondary gas source 32, and a third gas source 33. The delivery of gas to the chamber from the respective sources is controlled by flow control valves 36–38.

In one presently preferred embodiment, the primary etching gas consists of a mixture of $BCl_3$ at a pressure on the order of 70–200 microns and chlorine at a pressure on the order of 70–50 microns, the secondary gas consists of $SiCl_4$ at a pressure on the order of 190–300 microns, and helium at a pressure on the order of 700 microns–2.5 torr is included to prevent photoresist breakdown. The wafer to be etched is placed in the reactor chamber, and the chamber is evacuated by means of exhaust pump 26, following which the gases are admitted at the desired pressures. The DC bias, if any, and the RF power are then applied to the electrodes to ionize the gas and form a plasma of active species in the region between the electrodes. When the desired amount of aluminum has been removed, the electrodes are deenergized, the reagent gases are purged from the chamber, and the wafer is removed.

With the relatively high pressure employed in the etching process, it is possible to use a greater power density than has heretofore been possible in planar reactors. This results in faster removal of aluminum than has heretofore been possible. With a 3½–4½ inch electrodes, an energizing power of 50–400 watts has been found to give good results. The aluminum is removed at a rate on the order of 5,000–50,000 angstroms/minute compared to only about 1500 angstroms/minute with prior art techniques.

The significant increase in etching rate provided by the invention makes it feasible to process wafers on an individual basis, rather than in batches. For example, a one micron film of aluminum can be removed from a 3 inch wafer patterned with AZ-1350 positive photoresist in approximately one minute.

The combination of gases employed in the process is important. The primary gas mixture determines the etching rate, i.e., the rate at which the aluminum is removed, and the secondary gas controls the anisotropic character or direction of the etch and prevents undercutting of photoresist. The third gas is a good thermal conductor, and it also helps in preventing degredation of the photoresist. One presently preferred gas mixture comprises a primary gas mixture consisting of $BCl_3$ at a pressure on the order of 150 microns and chlorine at a pressure on the order of 155 microns, a secondary gas consisting of $SiCl_4$ at a pressure on the order of 210 microns, and a third gas consisting of helium at a pressure on the order of 1.1 torr. However, other gases can be employed in the mixture. For example, a mixture of $CCl_4$ and chlorine can be employed at the primary etching gas, and $CH_3Cl$ and/or $CCl_4$ can be employed as the secondary gas.

The etching process and gas mixture of the invention have a number of important features and advantages. Generation of a stable, uniform plasma at higher pressure and power levels has provided significantly faster etching of aluminum than has been possible heretofore in a planar reactor. Because of this increase in speed, wafers can be processed on an individual basis rather than in batches. The use of a high pressure in combination with a high power keeps the number of high energy species at a minimum, while providing a very high level of reactive species. In addition, the anistropy or directionality of the etch can be controlled, and undercutting and degradation of photoresist are minimized.

It is apparent from the foregoing that a new and improved process and gas mixture have been provided for etching aluminum in a planar reactor. While only certain presently preferred embodiments have been described in detail, as will be apparent to those familiar with the art, certain changes and modifications can be made without departing from the scope of the invention as defined by the following claims.

We claim:

1. In a process for etching aluminum in a reactor having a chamber and a pair of spaced apart generally planar electrodes, the steps of: positioning the aluminium between the electrodes in the reactor chamber, admitting a primary etching gas mixture selected from the group consisting of $BCl_3$ and chlorine, $CCl_4$ and chlorine, and combinations thereof to the chamber at a pressure on the order of 140–450 microns, admitting a secondary gas selected from the group consisting of $SiCl_4$, $CHCl_3$, $CCl_4$ and combinations thereof to the chamber at a pressure on the order of 190–300 microns to control the anisotropic character of the etch, said primary gas mixture and the secondary gas being present in the chamber at the same time, and energizing the electrodes to ionize the gas and form active species between the electrodes.

2. The process of claim 1 wherein the primary etching gas mixture contains $BCl_3$ at a pressure on the order of 70–200 microns and chlorine at a pressure on the order of 70–250 microns.

3. The process of claim 1 wherein photoresist is employed in proximity to the aluminum, and a third gas is admitted to the chamber to preserve the integrity of the photoresist.

4. The process of claim 3 wherein the third gas is helium at a pressure on the order of 0.7–2.5 torr.

5. The process of claim 1 wherein the gas is introduced into the chamber by diffusion through one of the electrodes into the region between the electrodes.

6. The process of claim 1 wherein a DC bias is maintained on the electrodes during the etching process.

7. The process of claim 1 wherein the electrodes are on the order of 3½–4½ inches in diameter, separated by a distance on the order of 0.5–2 inches, and energized with a power on the order of 50–400 watts.

8. In a process for removing aluminum from a substrate with photoresist masking in a reactor having a chamber and a pair of generally planar electrodes, the steps of: positioning the substrate between the electrodes in the reactor chamber, admitting a primary etching gas comprising a mixture of $BCl_3$ at a pressure on the order of 150 microns and chlorine at a pressure on the order of 155 microns to the chamber, admitting $SiCl_4$ to the chamber at a pressure on the order of 190–300 microns to control the anisotropic character of the aluminum removal, admitting helium to the chamber at a pressure on the order of 0.7–1.1 torr to prevent breakdown of the photoresist, and energizing the electrodes to ionize the gas between the electrodes.

9. The process of claim 8 wherein the gas is introduced into the chamber by diffusion through one of the electrodes into the region between the electrodes.

10. A gas mixture for etching aluminum in a plasma environment, comprising: a primary etching gas comprising a mixture of $BCl_3$ at a pressure on the order of 70–200 microns and chlorine at a pressure on the order of 70–250 microns, and a secondary gas comprising $SiCl_4$ at a pressure on the order of 190–300 microns for controlling the anisotropic character of the etch.

11. The gas mixture of claim 10 including a third gas comprising helium at a pressure on the order of 0.7–1 torr for preserving the integrity of photoresist in a proximity to the aluminum.

* * * * *